April 14, 1970 HYOGO HIROHATA ET AL 3,506,482

METHOD OF MAKING PRINTED CIRCUITS

Filed April 25, 1967

INVENTORS
HYOGO HIROHATA
TSUNESHI NAKAMURA

BY, Wenderoth, Lind & Ponack,
ATTORNEYS

United States Patent Office
3,506,482
Patented Apr. 14, 1970

3,506,482
METHOD OF MAKING PRINTED CIRCUITS

Hyogo Hirohata, Neyagawa-shi, and Tsuneshi Nakamura, Hirakata-shi, Japan, assignors to Matsushita Electric Industrial Co., Ltd., Osaka, Japan Filed Apr. 25, 1967, Ser. No. 633,567
The portion of the term of the patent subsequent to July 9, 1985, has been disclaimed
Int. Cl. B44d *1/18;* B41m *3/08;* H05k *3/12*
U.S. Cl. 117—212 9 Claims

ABSTRACT OF THE DISCLOSURE

A method for forming printed circuits which comprises printing a curable adhesive ink in a predetermined pattern onto an insulating base, applying metal powder onto the printed insulating base whereby discrete particles of said metal powder are retained on the printed adhesive ink only, curing said adhesive ink so as to fix said discrete particles of metal powder thereon, holing said insulating base at predetermined positions, immersing said holed insulating base successively into an aqueous solution of stannous chloride and an aqueous solution of palladium chloride for producing an activating agent thereon, brushing and washing the two surfaces of said base so that said two surfaces are free from said activating agent while the hole walls retain said activating agent, and treating the resulting base with an electroless metal deposition bath to adherently deposit electroless metal directly on said hole walls as well as on said cured adhesive including fixed metal powder so as to form a conducting pattern provided with plated-through holes.

METHOD OF MAKING PRINTED CIRCUITS

The present invention relates to a novel and improved method of making printed circuits on insulating supports and more particularly to a method of making printed circuits provided with plated-through holes.

The use of printed-circuit boards to interconnect electronic components has become widespread. This trend has been promoted by the requirement for miniaturization and reliability in various electronic equipments and by the need for labor saving.

One important method in practical use is the etched copper laminate method employing an expensive copper clad laminate and another is the pressed powder method. U.S. Patent No. 3,226,256 of Frederick W. Schneble has disclosed a method for making a printed circuit in which an insulating base is printed with an ink having a catalytic agent and then treated with an electroless metal deposition bath. These prior methods present difficulty in facilitating so-called plated-through holes. Printed-circuit boards are required to be holed at predetermined positions for connecting external components. When the walls of the holes are not plated with metal suitable for soldering, it is difficult to connect the external components inserted in the holes by employing dip soldering.

Therefore, it is a principal object of this invention to provide a method of making printed-circuit boards provided with plated-through holes.

Another object of this invention is to provide a method of making printed circuits on an insulating base without employing the expensive copper clad laminate.

These and other objects of this invention will become apparent upon consideration of the following description taken together with accompanying drawings in which.

Figure 1:
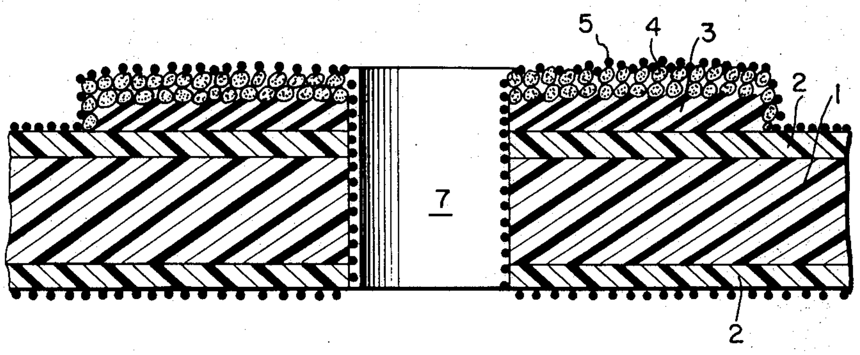
FIG. 1 is a cross-sectional view—somewhat diagrammatic and on an enlarged scale—of the printed-circuit board at a step in advance of the electroless metal deposition step.

Referring to FIG. 1, an insulating base 1 is printed with an adhesive ink 3 in a predetermined pattern. Metal powder 4 is spread all over the surface of said printed base 1 and is pressed down into said adhesive ink by, for example, passing between two rollers or pressing a flat plate covering the metal powder 4 so that discrete particles of the latter adhere to said adhesive ink 3. Metal powder 4 on the surface free from said adhesive ink 3 can be removed easily by shaking and inclining said base 1. Said adhesive ink 3 with adherent metal powder 4 is cured by a per se well known method for fixing said discrete particles of metal powder 4 thereon. The base provided with the cured adhesive ink is holed at predetermined positions by any conventional method such as drilling or punching. Holes 7 so produced are prepared for inserting external components therein. The base 1 with holes 7 is immersed into an aqueous solution of stannous chloride and then into an aqueous solution of palladium chloride for activating the two surfaces of the base and the wall of the holes. Palladium ion is reduced by stannous ion into palladium particles which act as an activating agent for the electroless metal deposition. The activating agent 5 resulting from the above solutions is adsorbed strongly on the wall but only weakly on the two said surfaces.

The two surfaces are brushed by, for example, a wire brush and washed with water for removing said activating agent therefrom. The activating agent still remains on the wall of holes 7 after the brushing and washing operations.

Figure 2:
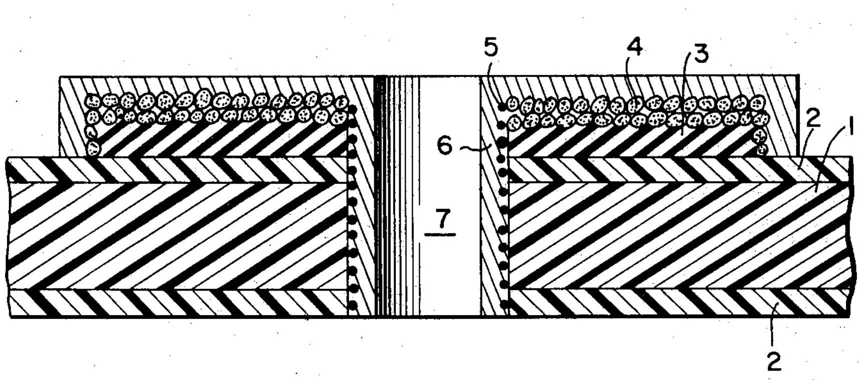
FIG. 2 is a cross-sectional view—somewhat diagrammatic and on an enlarged scale—of the printed-circuit board provided with plated-through holes in accordance with the present invention.

The resulting base is treated with an electroless metal deposition bath in a per se conventional manner to deposit said metal 6 thereon. The electroless metal deposition takes place on the metal powder 4 fixed in the cured adhesive ink as well as on the wall of said holes 7 so as to form a conducting pattern provided with plated-through holes as shown in FIG. 2.

It is preferable for achieving the conductive pattern and plated-through holes at one operation that each step of the manufacturing process be carried out in the order outlined above, i.e. printing adhesive ink→applying metal powder→curing the ink with adherent metal powder→making holes→immersing in aqueous solutions of stannous chloride and palladium chloride→brushing and washing→electroless metal depositing. The order, however, can be changed for obtaining similar effects to those mentioned above.

It has been discovered according to this invention that so-called plated-through holes in the printed circuit boards can be effected at a low cost by employing the pressed powder method in association with the electroless metal deposition method. The present invention is based mainly on the discovery that the activating agent is adsorbed by the walls of holes more strongly than by the surface of the insulating base. Therefore, the activating agent on the surface can be removed easily in a simple manner, for example, by brushing and washing the surface of the base which is has immersed in aqueous solutions of stannous chloride and palladium chloride, while the activating agent remains on the hole wall. The resultant base can be provided with a conductive pattern combined with plated-through holes at one operation by treating with the electroless metal deposition bath.

Said insulating base 1 can be made of glass plate, ceramic plate or resin plate such as phenol-formaldehyde resin, epoxy resin, melamine resin and any others having a high electric resistance and a high mechanical strength and a high resistance to heat and chemicals. Preferable insulating base 1 comprises a paper base phenolic resin laminate, because holes 7 thereof are provided with roughened surface walls for promoting the adsorption of said activating agent.

It is required that the surface of said insulating base be smooth and that it do not absorb the activating agent so as to prevent the surface from being plated by electroless metal deposition. For this purpose, when the surface of the insulating base does not satisfy the above requirement, insulating paint or varnish 2 having superior electrical properties and high resistance to heat and chemicals, such as epoxy resin and phenol-formaldehyde resin, is applied to the surface of said insulating bases as illustrated in FIGS. 1 and 2. Conventional paper base phenolic resin laminates can achieve superior resultant printed-circuit boards provided with plated-through holes when said laminates are coated with phenol-formaldehyde resin varnish in accordance with the invention.

Adhesive ink may consist of adhesive resin such as phenolic resin, epoxy resin, rubber phenol or polyvinylbutyral and a filler such as carbon, titanium oxide, zinc oxide or any other conventional pigment. These resins have an excellent adhesive force and have superior electrical properties and a high resistance to heat and chemicals. Said resin is admixed with said filler in a suitable solvent so as to adjust the viscosity and to obtain properties capable of use as a printing ink.

Preferable adhesive ink 3 can be made of epoxy resin when a phenolic resin laminate is employed as an insulating base 1.

An adhesive ink so produced is printed on said insulating base in a predetermined pattern by per se conventional methods. A preferable method is the silk screen process which can produce a suitable thickness of 20 to 50 microns of printed adhesive ink. It is difficult to achieve sufficient adherence of the metal powder to the printed ink at a thickness less than 20 microns.

The metal powder acts as a catalyst for electroless metal deposition. Therefore, it is necessary that the metal powder comprises copper, nickel, silver, gold, platinum, palladium or their alloys for electroless copper deposition; and nickel, iron, cobalt, aluminum, beryllium, platinum, palladium, rhodium or their alloys for electroless nickel or cobalt deposition.

The average size of the metal powder particles 4 is required to be approximately equal to or slightly smaller than the thickness of the printed ink 3 for achieving a superior bonding strength between the metal powder and the cured adhesive ink. A superior combination comprises 20 to 50 microns of thickness of printed ink and 20 to 40 microns of average size of the metal powder particles. It is also advantageous that the shape of the metal powder particles be of a dendritic form. When the metal powder has an average size smaller than 20 microns, the adhesive strength is poor and the metal powder is apt to sink into the ink. Metal powder particles having an average size larger than 40 microns result in poor adhesive strength and a rough surface of fixed metal powder.

The holed insulating base is activated for an electroless metal deposition procedure by per se conventional methods. The holed insulating base is immersed in an aqueous solution of stannous chloride and washed slightly, then immersed in an aqueous solution of palladium chloride and washed with water thoroughly. The activating agent is adsorbed weakly on the two smooth surfaces of the base 1 and strongly on the wall of the holes. Therefore, adsorbed activating agent on the base is removed easily by brushing and washing the two surfaces of said insulating base, while the activating agent on the wall of the holes remains.

Operable electroless metal deposition baths are, e.g. a Ni bath, Co bath, or Cu bath. The metal powder fixed in the adhesive ink acts as a catalytic agent for the electroless metal deposition in connection with a suitable combination of metal powder and electroless deposited metal illustrated above. When the insulating base provided with fixed metal powder is immersed in said electroless metal deposition bath, the electroless metal is deposited on the metal powder fixed in the cured ink and also is deposited on the wall of the holes having an activating agent. These metal deposits increase with the lapse of time and finally form the desired conductor on the printed ink as well as on the wall of the holes.

The following example of the specific new method is given by way of illustration and should not be construed as limitative.

Paper base phenolic resin laminate is immersed into phenolic resin varnish having a viscosity of 400 to 500 centipoises. The phenolic resin varnish thus applied to all the surfaces of the said base is cured at 130 to 140° C. for 1 hour. The said base coated with the varnish is then printed with an adhesive ink in a predetermined pattern by a silk screen method, said adhesive ink comprising Epoxy resin—500 grams
Polyamide hardener—500 grams
Carbon—50–100 grams
Benzyl alcohol—50–100 milliliters The printed ink so prepared has a thickness ranging from 20 to 50 microns. Electrolytic copper powder (average size about 30 microns) is spread in a thickness of 1 to 2 mm. on the surface of the printed insulating base and slightly pressed by rubber rollers. The copper powder at any other place than the printed adhesive ink is removed by shaking and inclining the base. The printed insulating base thus provided with the adherent copper powder is heated at 130 to 140° C. for 50 to 60 minutes so as to cure the adhesive ink. Consequently, the copper powder is strongly fixed in a predeterminate pattern on the insulating base.

The insulating base is then holed by punching after curing the adhesive ink.

The holed insulating base is cleaned with an aqueous solution of 5% nitric acid for removing rust and is cleaned again with trichlorethylene for removing grease. The cleaned insulating base is immersed into an aqueous solution of stannous chloride for five minutes and thereafter washed with water slightly. The composition of the aqueous solution of stannous chloride comprises, per liter $SnCl_2 \cdot 2H_2O$—2 grams
Conc. HCl—10 milliters Successively, said insulating base is immersed into an aqueous solution of palladium chloride for five minutes and thereafter washed with water thoroughly. The composition of the aqueous solution of palladium chloride comprises, per liter $PdCl_2$—0.01 gram
Conc. HCl—0.01 milliter The nuclei of palladium metal adhere to all surfaces of the base and to the wall of the holes after the immersion.

The surfaces of the base thus provided with palladium nuclei are brushed with a wire brush and simultaneously washed with water for removing the palladium nuclei from the surfaces only. The resultant base retaining the Pd particles on the hole walls is immersed into an electroless copper deposition bath comprising 0.05 mole of cupric sulfate, 0.06 mole of ethylenediaminetetracetic acid, 0.34 mole of sodium hydroxide and 0.20 mole of formaldehyde in one liter of water at 30 to 32° C. so as to produce a conducting pattern combined with plated-through holes.

What is claimed is:

1. A method for forming printed circuits which comprises printing a curable adhesive ink in a predetermined pattern onto an insulating base, applying metal powder onto the printed insulating base whereby discrete particles of said metal powder are retained on the printed adhesive ink only, curing said adhesive ink so as to fix said discrete particles of metal powder thereon, holing said insulating base at predetermined positions, immersing said holed insulating base successively into an aqueous solution of stannous chloride and an aqueous solution of palladium chloride for producing an activating agent thereon, brushing and washing the two surfaces of said base so that said two surfaces are free from said activating agent while the hole walls retain said activating agent, and treating the resulting base with an electroless metal deposition bath to adherently deposit electroless metal directly on said hole walls as well as on said cured adhesive including fixed metal powder so as to form a conducting pattern provided with plated-through holes.

2. A method for forming printed circuits as defined in claim 1, wherein said insulating base is of phenolic resin laminate.

3. A method for forming printed circuits as defined in claim 1, wherein said insulating base is initially coated at the two surfaces thereof with phenolic resin varnish for facilitating removal of catalytic agent.

4. A method for forming printed circuits as defined in claim 1, wherein the printed adhesive ink is of a thickness approximately equal to or slightly greater than the average size of the applied metal powder particles.

5. A method for forming printed circuits as defined in claim 1, wherein the printed adhesive ink is 20 to 50 microns in thickness and the average size of applied metal powder particles is 20 to 40 microns.

6. A method for forming printed circuits as defined in claim 1, wherein said adhesive ink comprises epoxy resin.

7. A method for forming printed circuits as defined in claim 1, wherein said metal powder is a member selected from the group consisting of nickel, copper, silver, gold, platinum, palladium, and their alloys and wherein said resulting base is treated with an electroless copper deposition bath.

8. A method for forming printed circuits as defined in claim 1, wherein said metal powder is a member selected from the group consisting of iron, nickel, cobalt, aluminum, beryllium, platinum, palladium, rhodium, and their alloys and wherein said resulting base is treated with an electroless nickel deposition bath.

9. A method for forming printed circuits which comprises printing an adhesive ink of epoxy resin in a predetermined pattern onto a phenolic resin laminate base which is coated at the two surfaces thereof with phenol resin varnish, applying copper powder onto the printed base so as to retain discrete particles of said copper powder on the printed adhesive ink only, said adhesive ink being printed in a thickness approximately equal to or slightly thicker than the average size of applied copper powder particles, curing said discrete particles thereon, holing said base at predetermined positions, immersing said holed base successively into an aqueous solution of stannous chloride and an aqueous solution of palladium chloride for producing an activating agent, brushing and washing the two surfaces of said base so that said two surfaces are free from said activating agent while the hole walls retain said catalytic agent, and treating the resultant base with an electroless copper deposition bath to adherently deposit electroless copper directly on said hole walls as well as on said cured adhesive including fixed copper powder so as to form a conducting pattern provided with plated-through holes.

References Cited

UNITED STATES PATENTS 3,391,455 7/1968 Hirohata et al. -------- 29—625
3,259,559 7/1966 Schneble et al. ---- 117—212 X ALFRED L. LEAVITT, Primary Examiner A. GRIMALDI, Assistant Examiner U.S. Cl. X.R.

117—217, 218; 29—625; 174—68.5